United States Patent
Kern et al.

(10) Patent No.: US 9,595,354 B2
(45) Date of Patent: Mar. 14, 2017

(54) NONVOLATILE MEMORY REFRESH

(71) Applicant: Infineon Technologies AG, Neubiberg (DE)

(72) Inventors: Thomas Kern, Ascheim (DE); Karl Hofmann, Munich (DE); Michael Goessel, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 44 days.

(21) Appl. No.: 14/570,219

(22) Filed: Dec. 15, 2014

(65) Prior Publication Data

US 2016/0172029 A1    Jun. 16, 2016

(51) Int. Cl.

| G11C 29/00 | (2006.01) |
| --- | --- |
| G11C 29/02 | (2006.01) |
| G06F 11/10 | (2006.01) |
| H03M 13/37 | (2006.01) |
| G11C 13/00 | (2006.01) |
| G11C 11/16 | (2006.01) |
| G11C 29/52 | (2006.01) |
| G11C 7/04 | (2006.01) |
| G11C 29/42 | (2006.01) |
| G11C 29/50 | (2006.01) |

(52) U.S. Cl.
CPC ............ *G11C 29/76* (2013.01); *G06F 11/106* (2013.01); *G06F 11/1048* (2013.01); *G11C 7/04* (2013.01); *G11C 11/1673* (2013.01); *G11C 13/0033* (2013.01); *G11C 29/028* (2013.01); *G11C 29/42* (2013.01); *G11C 29/50016* (2013.01); *G11C 29/52* (2013.01); *H03M 13/3715* (2013.01); *G11C 11/1653* (2013.01); *G11C 11/1675* (2013.01)

(58) Field of Classification Search
CPC ... G11C 29/76; G11C 29/028; G06F 11/1048; H03M 13/3715
See application file for complete search history.

(56) References Cited

U.S. PATENT DOCUMENTS

| 5,199,033 | A | * | 3/1993 | McGeoch | G11C 29/76 365/168 |
| --- | --- | --- | --- | --- | --- |
| 5,699,078 | A | * | 12/1997 | Yamazaki | G09G 3/2018 345/89 |
| 5,909,404 | A | * | 6/1999 | Schwarz | G11C 29/50 365/200 |
| 7,894,289 | B2 | * | 2/2011 | Pawlowski | G06F 11/1044 365/222 |
| 2002/0176310 | A1 | * | 11/2002 | Hilbert | G11C 29/70 365/230.06 |

(Continued)

FOREIGN PATENT DOCUMENTS

| JP | H1139221 A | 2/1999 |
| --- | --- | --- |
| JP | 2000173277 A | 6/2000 |

(Continued)

*Primary Examiner* — Joseph D Torres
(74) *Attorney, Agent, or Firm* — Schiff Hardin LLP

(57) ABSTRACT

A system and method of refreshing a nonvolatile memory having memory cells. The method includes identifying one or more of the memory cells that do not satisfy a data retention test; remapping the one or more identified memory cells from original memory addresses to spare memory addresses; and refreshing the identified memory cells.

18 Claims, 4 Drawing Sheets

(56) References Cited

U.S. PATENT DOCUMENTS

| | | | | |
|---|---|---|---|---|
| 2005/0022065 A1* | 1/2005 | Dixon | ............... | G06F 11/106 714/42 |
| 2005/0120265 A1* | 6/2005 | Pline | ............... | G06F 11/1008 714/6.32 |
| 2006/0285409 A1* | 12/2006 | Hummler | ............... | G06F 11/106 365/222 |
| 2006/0285410 A1* | 12/2006 | Hummler | ............... | G06F 11/106 365/222 |
| 2007/0030746 A1* | 2/2007 | Best | ............... | G11C 11/406 365/222 |
| 2007/0033338 A1* | 2/2007 | Tsern | ............... | G11C 11/406 711/106 |
| 2007/0033339 A1* | 2/2007 | Best | ............... | G11C 11/406 711/106 |
| 2009/0003046 A1* | 1/2009 | Nirschl | ............... | G11C 11/5678 365/163 |
| 2010/0096716 A1* | 4/2010 | Ranjan | ............... | B82Y 10/00 257/421 |
| 2013/0286711 A1* | 10/2013 | Lung | ............... | G11C 17/06 365/148 |
| 2013/0318418 A1* | 11/2013 | Bedeschi | ............... | G06F 11/1048 714/758 |
| 2014/0059405 A1 | 2/2014 | Syu et al. | | |
| 2014/0189433 A1* | 7/2014 | Schoenborn | ............... | G11C 29/06 714/42 |
| 2014/0289574 A1* | 9/2014 | Tsern | ............... | G11C 29/50016 714/718 |
| 2015/0039848 A1* | 2/2015 | Chun | ............... | G11C 29/42 711/202 |
| 2015/0227461 A1* | 8/2015 | Benedict | ............... | G11C 29/70 711/210 |
| 2016/0011930 A1* | 1/2016 | Yeh | ............... | G06F 11/0793 714/15 |

FOREIGN PATENT DOCUMENTS

| | | |
|---|---|---|
| JP | 2006202383 A | 8/2006 |
| JP | 2011-060082 A | 3/2011 |

* cited by examiner

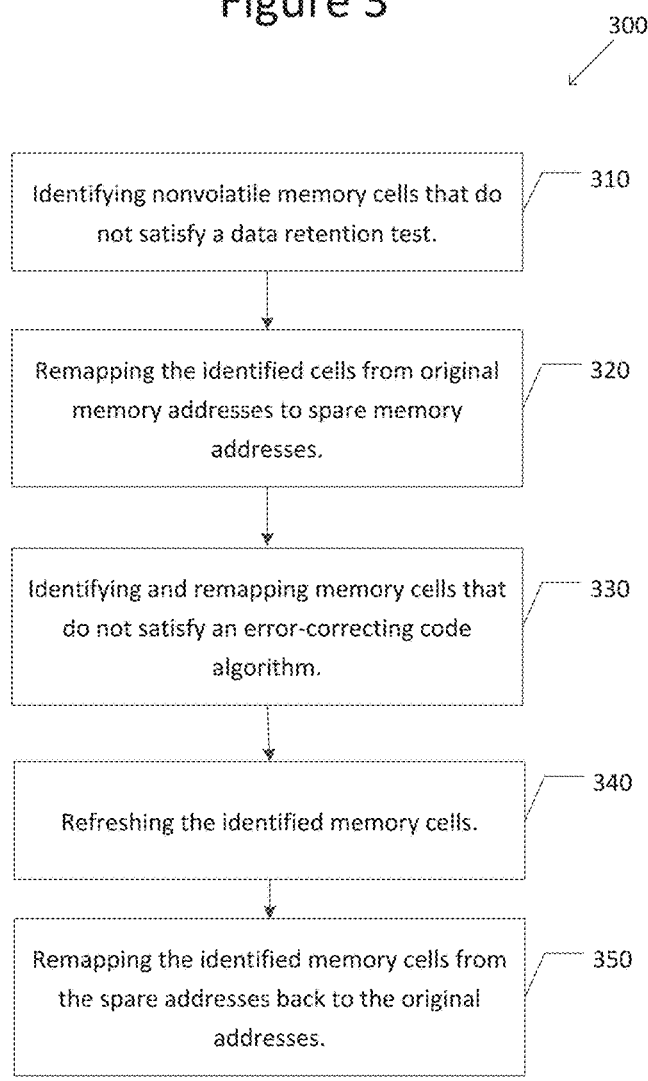

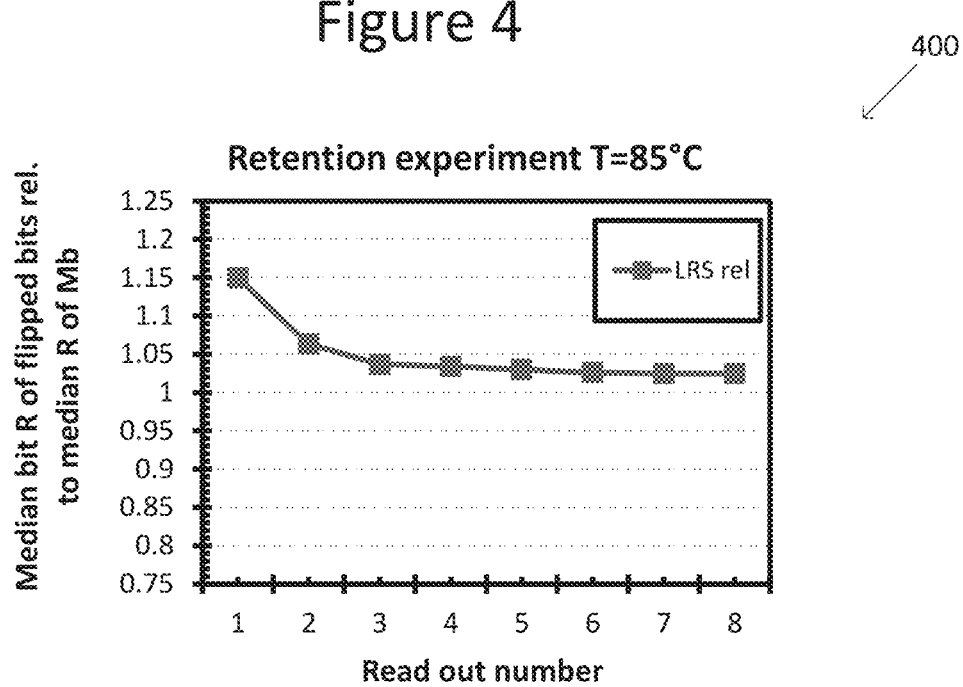

NONVOLATILE MEMORY REFRESH

BACKGROUND

Nonvolatile memory suffers from data retention problems at high temperatures. Examples of nonvolatile memory include, but are not limited to, spin transfer torque magnetic random access memory (STT-MRAM), resistive random access memory (RRAM or ReRAM), and phase-change random access memory (PC-RAM). The expected data retention performance of, for example, STT-MRAM, at an automotive temperature of 175° C. is around twenty hours, which is much too low for automotive products.

BRIEF DESCRIPTION OF THE DRAWINGS

FIG. 3 illustrates a flowchart of a method of refreshing a nonvolatile memory.

FIG. 4 illustrates a graph of resistance versus data retention read-out number.

DETAILED DESCRIPTION

The present disclosure is directed to refreshing a nonvolatile memory having memory cells. Weak memory cells that do not satisfy a data retention test are identified. These identified cells are remapped from their original memory addresses to spare memory addresses, and during operation are continuously refreshed in order to preserve stored data.

Figure 1:
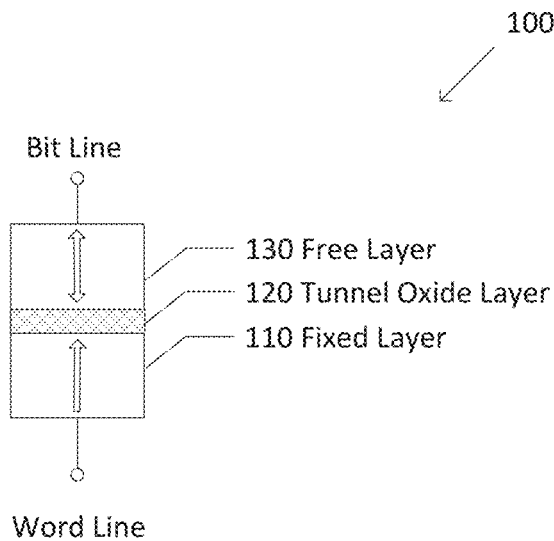
FIG. 1 illustrates a schematic diagram of a spin transfer torque magnetic random access memory (STT-M RAM).

FIG. 1 illustrates a schematic diagram of a spin transfer torque magnetic random access memory (STT-MRAM) 100. Unlike typical RAM technologies, which store data as electric charge, MRAM data is stored by magnetoresistive layers 110, 130, which are separated by a tunnel oxide layer 120. Each of the magnetoresistive layers 110, 130 holds a magnetization. The magnetization of the fixed layer 110 is fixed in its magnetic orientation, and the magnetization of the free layer 130 can be changed by a spin polarized programming current. Thus, the programming current can cause the magnetic orientations of the two magnetic layers to be either in a same direction, providing a lower electrical resistance across the layers ("0" state), or in opposing directions, providing a higher electrical resistance across the layers ("1" state). The switching of the magnetic orientation of the free layer 130 and the resulting high or low resistance states across the magnetic layers provide for the write and read operations of the typical MRAM cell. An unintended flip, that is, an unintended switch of the magnetic orientation of the free layer 130, can result if the STT-MRAM 100 is subjected to a high temperature.

Data retention behavior of the STT-M RAM 100 is determined by its energy barrier, which separates the high and low resistance states. The larger the energy barrier, the more stable the memory cell against a thermal induced flip, and thus the better its data retention.

Figure 2:
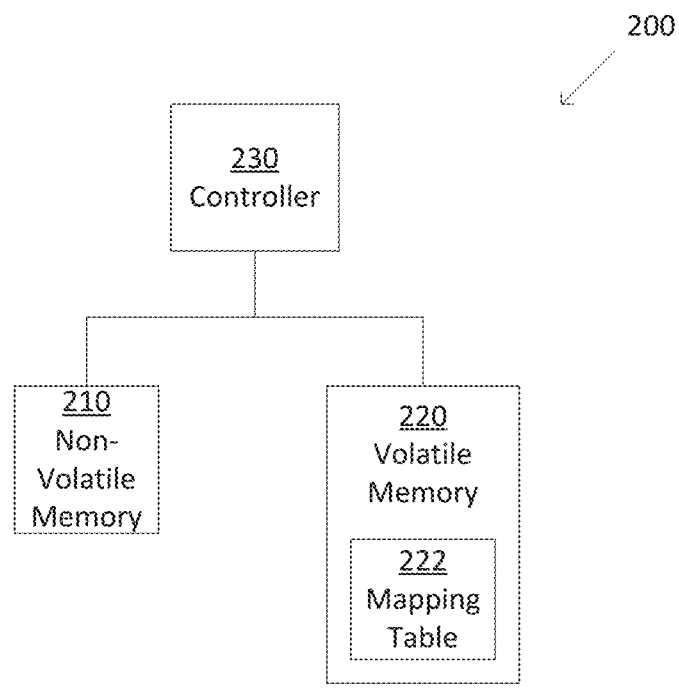
FIG. 2 illustrates a nonvolatile memory refresh system.

FIG. 2 illustrates a nonvolatile memory refresh system 200 including a nonvolatile memory 210, a volatile memory 220 having a mapping table 222, and a controller 230. The nonvolatile memory 210 may be a STT-M RAM 100, as described above with respect to FIG. 1.

FIG. 3 illustrates a flowchart 300 of a method of refreshing the nonvolatile memory 210. The steps of this method are performed under the control of the controller 230 shown in FIG. 2.

At Step 310, one or more nonvolatile memory cells that do not satisfy a data retention test, that is, are the weak memory cells, are identified. This identification may be performed at startup. Memory cells are formed as either weak or strong, and over their lifetimes do not to change in this respect.

The data retention test may be based on any of a number of measurable electrical characteristics. These electrical characteristics include, but are not limited to, write time, write current, resistance, read current, and/or energy barrier, as explained in more detail below.

A write time of a memory cell being less than a predetermined amount of time indicates poor data retention. During a first read-out weak memory cells are written quickly, whereas strong memory cells having better data retention require a longer write time.

A write current being less than a predetermined current value also indicates poor data retention.

A read current of a memory cell being less than a predetermined current value, and thus a resistance being greater than a predetermined resistance value, indicates poor data retention. An increased resistance may be a result of a reduced footprint of the STT-M RAM 210.

An energy barrier of a memory cell being less than a predetermined energy value also indicates poor data retention. On the other hand, a high energy barrier memory cell is more robust against a write impulse. The energy barrier is related to write current and write time in that a higher energy barrier results in a higher write current and a longer write time.

At Step 320, the one or more identified "weak" cells that have poor data retention are remapped from their original memory addresses to spare memory addresses in the data table 222 of the volatile memory 220. The volatile memory 220 may be a static random access memory (SRAM), for example, or any other volatile memory suitable for the intended purpose. No permanent mapping table 222 is required. This Step 320 may be performed at startup only, and/or repeatedly during operation, particularly during operation at high temperatures.

During operation, at Step 330, memory cells that do not satisfy an error-correcting code (ECC) algorithm are identified and remapped in the mapping table 222. Initially the nonvolatile memory 210 is not at a high temperature, and some weaker cells may still pass the initial data retention tests. As the temperature increases, these weaker memory cells may begin fail. Identifying these memory cells through the error-correcting code algorithm, or alternatively any other suitable algorithm, results in a filtering of further weak data retention memory cells.

At Step 340, the identified memory cells are continuously refreshed in a manner similar to that performed for a dynamic random access memory (DRAM). As is known, a memory refresh is a process of periodically reading information from an area of the memory and immediately rewriting the read information to the same area without modification, for the purpose of preserving the information. Step 340 may be performed repeatedly on the identified weak memory cells stored in the mapping table 222. While it is possible to perform a continuous refresh on all memory cells, such a process would require a significant amount of power. Another option is to perform a refresh on all memory cells, but more frequently on the identified weak memory cells.

Additionally, during the memory refresh the read information could be corrected by an ECC, and the ECC corrected data written into the respective memory cell. The ECC uses an error correction/error detection code that may be a Hamming code, a Hsiao-code, a BCH-code, a Reed-Solomon-code, a Cross-Parity code or any other error detecting/error correcting code appropriate for the situation.

STT-MRAM has, in theory, unlimited endurance and single bit write/erase capability, and thus additional writes due to refresh does not harm the nonvolatile memory 210. Typically a chip having a nonvolatile memory 210 is at high temperature only during operation, and thus power for the re-fresh is available.

At Step 350, the one or more identified memory cells may be remapped in the mapping table 222 from the spare addresses back to the original addresses. This remapping step may be performed at power-off, or alternatively, when the nonvolatile memory 210 ceases to be at a temperature that is greater than a predetermined temperature. At lower temperatures, there is less of an issue with data retention.

This disclosure includes a computer program product embodied on a non-transitory computer-readable medium comprising program instructions configured such that when executed by processing circuitry cause the processing circuitry to implement the method of FIG. 3.

Resistive random access memory (Re-RAM) and phase-change random access memory (PC-RAM) are not capable of identifying in advance memory cells with poor data retention. However, these nonvolatile memories have a drift in resistance versus time. The resistance drift is generally an indication for a needed re-write of the bit, but no information of a resulting data retention performance is available. Steps 310, 320, 330 discussed above with respect to FIG. 3 are not meaningful with respect to these memories. Instead a simple refresh is appropriate.

FIG. 4 illustrates a graph 400 of resistance versus data retention read-out number. More specifically, graph 400 shows the memory cell (bit) resistance versus the data retention read-out number. The memory cells having poor data retention that flip at an early read-out, have a higher resistance.

Figure 5A:
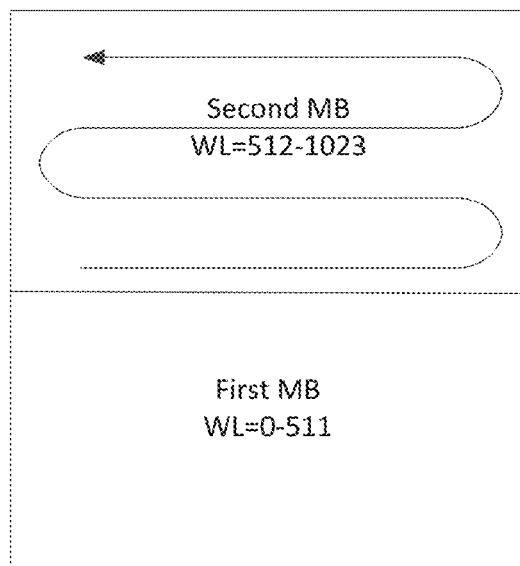
FIG. 5A illustrates a nonvolatile memory subject to a refresh.
Figure 5B:
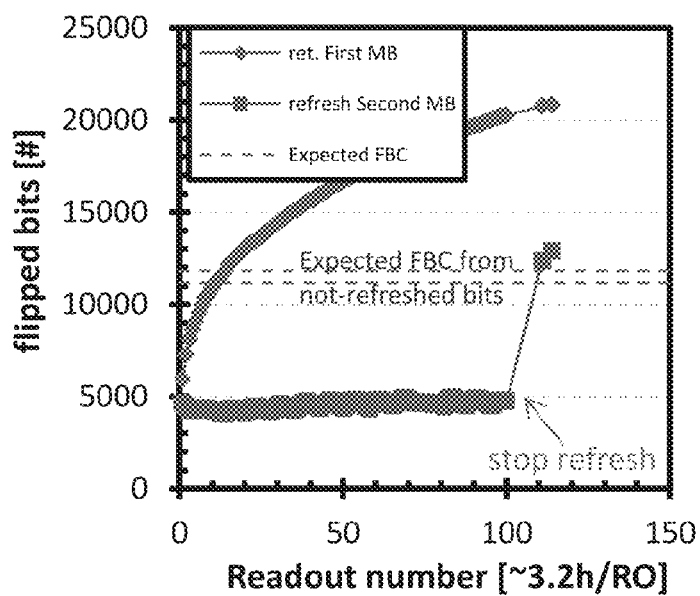
FIG. 5B illustrates a graph of flipped bits versus data retention read-out number.

FIG. 5A illustrates a nonvolatile memory 500A of 2 MB subject to a refresh, and FIG. 5B illustrates a graph 500B of flipped memory cells (bits) versus data retention read-out number.

The 2 MB of the memory 500A were written with a fixed pattern. The first MB in the lower half of the memory is stored, whereas the identified flipped bits of the second MB in the upper half of the memory are continuously refreshed. The graph 500B shows that the refreshed MB has a constant fail-bit count (FBC) (see the lower line identified with squares), whereas the first MB shows the expected increased failed bit count (see the upper line identified with diamonds). After the refresh is terminated, the number of flipped memory cells (see the lower line identified with squares) increases in a highly comparable way as compared with the first MB (see the upper line identified with diamonds).

Alternative solutions to improve the data retention performance include a refresh without pre-selection and no address mapping, but this leads to higher power consumption. A software-controlled write-back is an option, though is prone to errors. There is also permanent mapping of weak address, but in such a case a highly reliable nonvolatile memory map in a random access memory is required.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A method of refreshing a nonvolatile memory having memory cells, the method comprising:
identifying one or more of the memory cells that do not satisfy a data retention test;
remapping the one or more identified memory cells from original memory addresses to spare memory addresses;
refreshing the one or more identified memory cells; and
remapping the one or more identified memory cells from the spare addresses back to the original addresses after the nonvolatile memory ceases to be at a temperature that is greater than a predetermined temperature.

2. The method of claim 1, wherein the spare addresses are located in a mapping table stored in a volatile memory.

3. The method of claim 1, wherein the spare addresses are located in a mapping table stored in a nonvolatile memory.

4. The method of claim 1, wherein the identifying and remapping steps are performed at startup.

5. The method of claim 1, further comprising:
identifying, using an error-correcting code algorithm, one or more of the memory cells having an error; and
remapping the one or more memory cells identified as having an error from original addresses to spare memory addresses.

6. The method of claim 5, wherein the refreshing step comprises:
reading data from the one or more identified memory cells;
correcting the read data the error-correcting algorithm; and
writing the corrected data to the one or more identified memory cells.

7. The method of claim 1, wherein the identifying and remapping steps are performed repeatedly.

8. The method of claim 1, wherein the identifying step comprises determining the one or more memory cells that have a write time that is less than a predetermined amount of time.

9. The method of claim 1, wherein the identifying step comprises determining the one or more memory cells that have a read current that is less than a predetermined current value.

10. The method of claim 1, wherein the identifying step comprises determining the one or more memory cells that have a write current that is less than a predetermined current value.

11. The method of claim 1, wherein the identifying step comprises determining the one or more memory cells that have a resistance that is greater than a predetermined resistance value.

12. The method of claim 1, wherein the identifying step comprises determining the one or more memory cells that have an energy barrier that is less than a predetermined energy value.

13. The method of claim 1, wherein the nonvolatile memory is a spin-transfer torque magnetic random access memory.

14. The method of claim 1, further comprising:
refreshing the one or more identified memory cells only.

15. The method of claim 1, further comprising:
refreshing the one or more identified memory cells more frequently than non-identified memory cells.

16. A memory refresh system, comprising:
a nonvolatile memory having memory cells;
a memory having a mapping table; and
a controller configured to:
identify one or more of the memory cells that do not satisfy a data retention test;
remap the one or more identified memory cells from original memory addresses to spare memory addresses;
refresh the identified memory cells; and
remap the one or more identified memory cells from the spare addresses back to the original addresses after the nonvolatile memory ceases to be at a temperature that is greater than a predetermined temperature.

17. The memory refresh system of claim 16, wherein the nonvolatile memory is a spin-transfer torque magnetic random access memory.

18. A computer program product embodied on a non-transitory computer-readable medium comprising program instructions configured such that when executed by processing circuitry cause the processing circuitry to implement a method of refreshing a nonvolatile memory having memory cells, the method comprising:
identifying one or more of the memory cells that do not satisfy a data retention test;
remapping the one or more identified memory cells from original memory addresses to spare memory addresses;
refreshing the one or more identified memory cells; and
remapping the one or more identified memory cells from the spare addresses back to the original addresses after the nonvolatile memory ceases to be at a temperature that is greater than a predetermined temperature.

* * * * *